(12) United States Patent
Burcsu et al.

(10) Patent No.: US 6,437,486 B1
(45) Date of Patent: Aug. 20, 2002

(54) ELECTROSTRICTIVE ACTUATOR USING FERROELECTRIC SINGLE CRYSTAL

(75) Inventors: Eric Burcsu; Kaushik Bhattacharya, both of Pasadena; Guruwaminaidu Ravichandran, Arcadia; Yi-Chung Shu, Pasadena, all of CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/541,388

(22) Filed: Mar. 31, 2000

Related U.S. Application Data
(60) Provisional application No. 60/127,471, filed on Mar. 31, 1999.

(51) Int. Cl.[7] .............................................. H01L 41/02
(52) U.S. Cl. ........................ 310/358; 310/328; 310/338
(58) Field of Search ................................ 310/358, 362, 310/328, 338, 339

(56) References Cited

U.S. PATENT DOCUMENTS

| | | | |
|---|---|---|---|
| 4,438,364 A | * | 3/1984 | Morison ...................... 310/328 |
| 5,804,907 A | | 9/1998 | Park et al. |
| 6,060,816 A | * | 5/2000 | Audren .................. 310/323.02 |

OTHER PUBLICATIONS

Burscu, et al., "Mechanics of large electrostriction in ferroelectrics", Proc. SPIE vol. 3992, Smart Structures ad Materials 2000: Active Materials: Behavior and Mechanics, C.S. Lynch, Ed. (Mar. 5–9, 2000).

* cited by examiner

Primary Examiner—Brian Sircus
Assistant Examiner—Michael C. Zarroli
(74) Attorney, Agent, or Firm—Fish & Richardson P.C.

(57) ABSTRACT

An electrostrictive actuator incorporating a single crystal ferroelectric material is subjected to combined electrical and mechanical loading. Electrodes are used to generate an electric field in a ferroelectric plate. The subsequent domain switching process produces large strains that can be recovered by applying stress with a mechanical load.

19 Claims, 9 Drawing Sheets

ELECTROSTRICTIVE ACTUATOR USING FERROELECTRIC SINGLE CRYSTAL

CROSS-REFERENCE TO RELATED APPLICATION

This application claims the priority of Provisional Application Ser. No. 60/127,471, filed Mar. 31, 1999.

BACKGROUND

Ferroelectric materials are used in a variety of sensor and actuator applications. These may be in the form of piezoelectric or electrostrictive polycrystalline ceramics. Applications for ferroelectric materials include micro-positioning, ultrasonics, stress measurement, active damping, and damage detection.

A ferroelectric material is-one that displays a spontaneous electric polarization. Typically, the material is paraelectric (nonpolar) at high temperatures and becomes ferroelectric below the Curie temperature, at which point it is polarized in a well-defined crystallographic direction. The material may polarize in any one of many crystallographically equivalent directions.

Often a crystal is not uniformly polarized, but rather has multiple "domains," each of which is polarized in one of the equivalent directions. The spontaneous polarization is accompanied by an elastic strain that depends on the direction of the polarization.

The domain patterns in a single crystal can be reoriented and their boundaries moved by applying an electric field or a mechanical stress to the ferroelectric material. Spontaneous polarization in response to an applied electric field tends to be in a direction closest to a direction of the applied electric field. Spontaneous polarization in response to an applied stress tends to be in the direction in which the strain is best aligned with the applied stress.

The behavior of many ferroelectric materials is characterized by good high frequency response and low hysteresis, however strains in such materials are relatively small, limited to about 0.1%.

SUMMARY

According to an embodiment, an apparatus includes a plate of ferroelectric material that is polarized in a first direction. The plate is compressed between opposing faces of the plate. Electrodes contacting each of the opposing faces of the plate are provided for producing an electric field in the ferroelectric material.

At a first voltage, an electric field produced in the plate causes the ferroelectric material to switch polarization to a second direction, producing strain in the plate.

The ferroelectric material may be selected from a number of compounds including, for example, barium titanate, potassium niobate, and lead titanate. The ferroelectric material may also be a solid solution of simple compounds that is ferroelectric at room temperature.

Loading plates can be used to compress the plate. The loading plates may produce a load in a range of from about 1 MPa to about 10 MPa.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

Like reference symbols in the various drawings indicate like elements.

DETAILED DESCRIPTION

Figure 1:
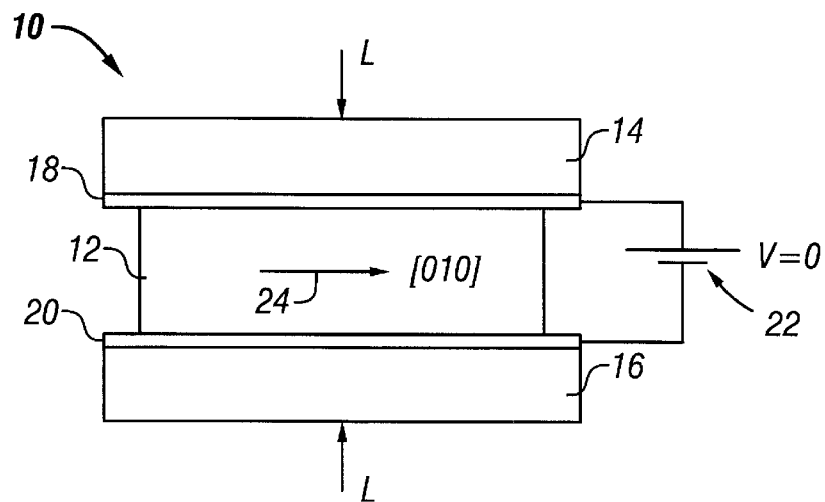
FIG. 1 is a side view of an actuator according to an embodiment.

FIG. 1 illustrates an electrostrictive actuator 10 according to an embodiment. A ferroelectric plate 12 of single crystal barium titanate (BaTiO$_3$) is sandwiched between two loading plates 14, 16, each having an electrically conductive layer 18, 20 serving as an electrode in contact with the ferroelectric plate.

A load L of between about 1 MPa and 10 MPa is placed on loading plates 14, 16 to produce compressive stress in the ferroelectric plate 12. The applied stress forces the polarization of the single crystal to be in-plane, in the [010] direction 24.

The electrodes 18, 20 are connected to a voltage source 22 are used to generate an electric field in the ferroelectric material. The subsequent domain switching process in the plate results in large strains and associated deformation of the plate. When the induced electric field is removed, the stress from the load L forces the polarization of the single crystal back in-plane in the [010] direction 24.

Figure 2A:
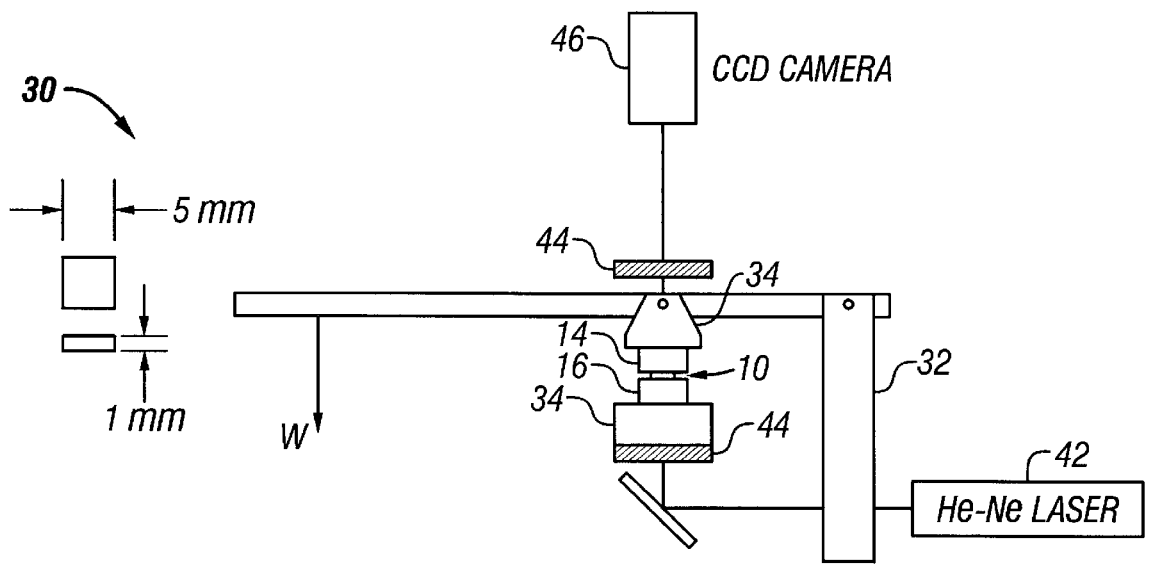
FIGS. 2A–C are schematic diagrams of the actuator of FIG. 1 and an apparatus for applying a load and measuring strain in the actuator.

FIG. 2A illustrates an apparatus 30 that places a constant compressive stress and variable electric field on actuator 10 and measures the induced electrostrictive strain. A load is generated using a dead weight W and a lever mechanism 32 to deliver a constant force to a loading frame 34. The force is transmitted to a pair of optically flat glass plates acting as loading plates 14, 16 that sandwich the ferroelectric plate 12. According to the present embodiment, the ferroelectric plate 12 is 5 mm×5 mm×1 mm.

Figure 2B:
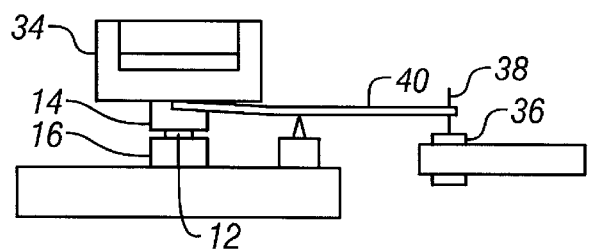
Figure 2C:
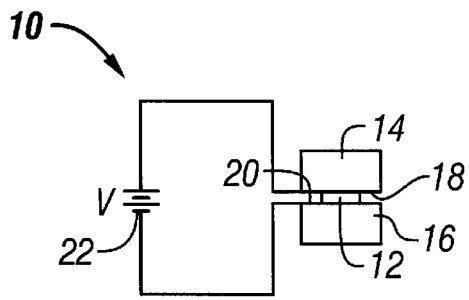

A semi-transparent gold film of approximately 300–400 angstroms is sputtered on the surface of each glass plate to function as electrodes 18, 20 (see FIG. 2C). The use of the glass plates and transparent electrodes allows direct observation of the actuator 10.

Electrodes 18, 20 are connected to high voltage power amplifier 22 which is capable of generating large electric fields. Electric field and current are measured by monitoring the amplifier voltage and current outputs and are recorded with a digital oscilloscope.

The crystal strain is measured by recording the displacement of load frame 34, which corresponds to the change in thickness of plate 12. The displacement is measured using a high-resolution linear variable differential transducer (LVDT) 36 shown in FIG. 2B. The LDTV core 38 is attached to a beam 40 which is actuated at the center of the loading frame 34.

A helium-neon laser 42 is used to illuminate the actuator 10 from below. The light passes through crossed polarizers 44, one below the specimen and one above, and the image is captured on video using a CCD camera 46. Tetragonal barium titanate is optically birefringent within the (001) and (010) planes, but is optically isotropic in the [001] direction. For this reason, 90° domain boundaries can be observed with polarized light.

Figure 3A:
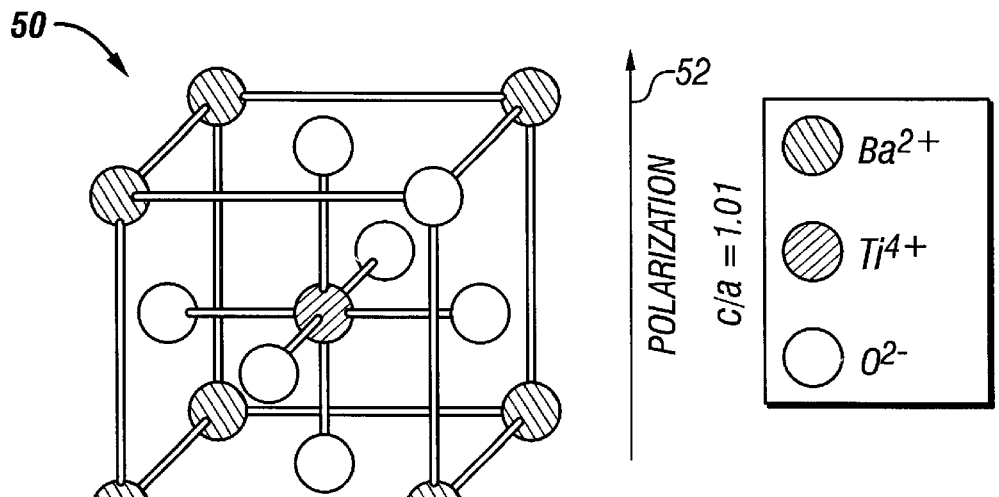
FIGS. 3A–C are perspective views of a barium titanate unit cell in cubic and polarized states according to an embodiment.
Figure 3B:
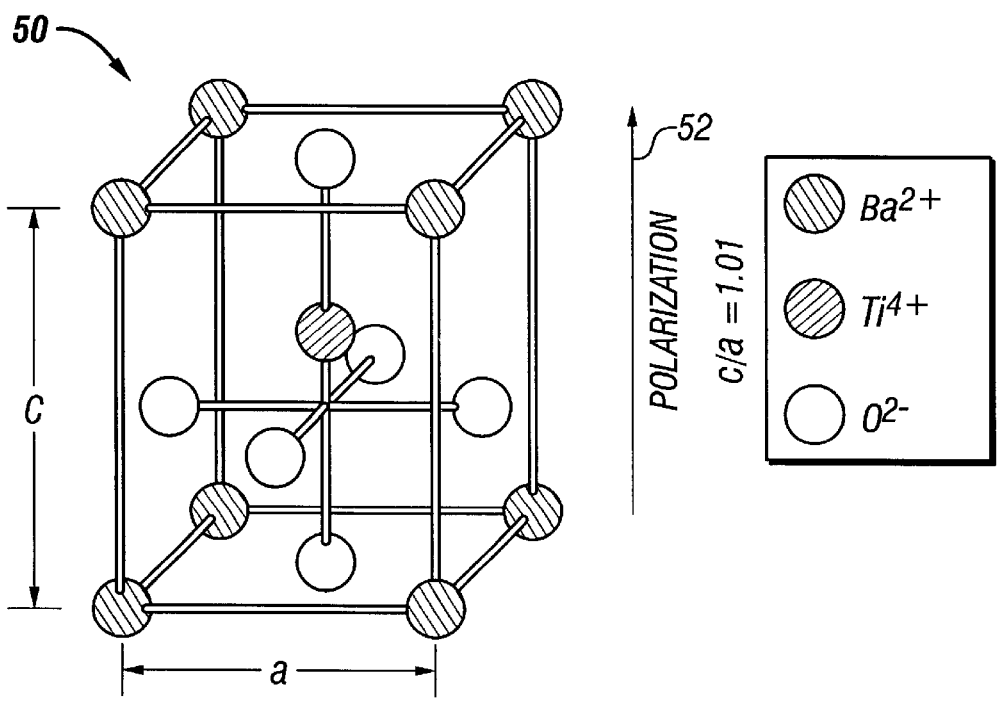

Barium titanate is a ferroelectric material of the perovskite class. At high temperature, a unit cell 50 of barium titanate has the cubic structure of perovskite, as shown in FIG. 3A. When cooled to below 120° C., it transforms to a tetragonal phase having dimensions (c) and (a) as shown in FIG. 3B. In addition to the strain induced by the lattice distortion, there is a spontaneous polarization along the axis 52 of the unit cell.

Figure 3C:
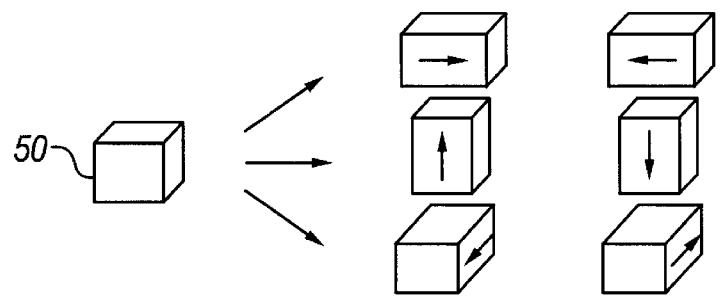

At phase transition, the unit cell 50 can take any of six crystallographically equivalent combinations of strain and polarization, as shown in FIG. 3C.

Figure 4:
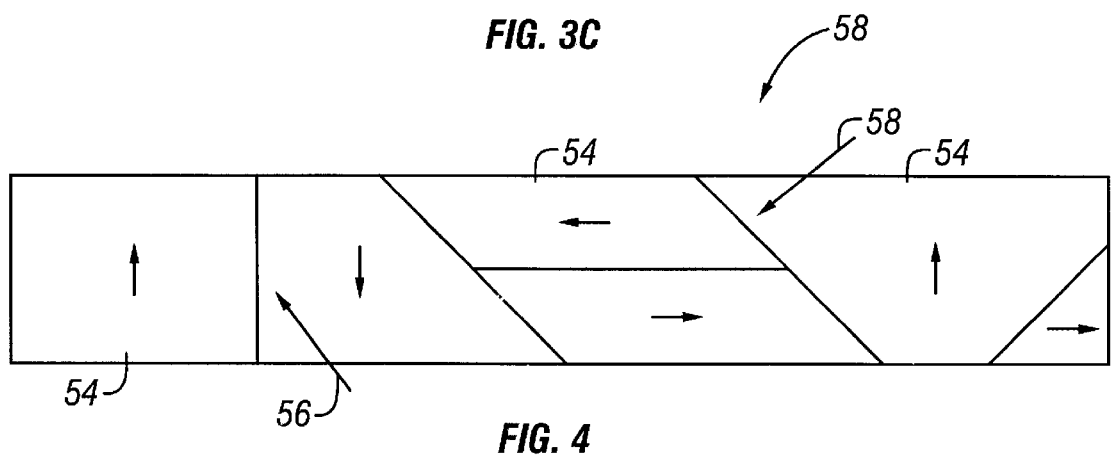
FIG. 4 is a schematic representing domains in a single crystal ferromagnetic material according to an embodiment.

Different regions of a single crystal or single grain in a polycrystal can take on different directions of polarization. A region of constant polarization is known as a ferroelectric domain 54, as shown in FIG. 4. Domains are separated by 90° or 180° domain boundaries 56, 58, respectively, which can be nucleated or moved by applying an electric field or stress. The process of changing the polarization direction of a domain by nucleation and growth or by wall motion is known as domain switching. Domain switching tends to change the macroscopic polarization direction and, in the case of 90° domain switching, produce an associated strain that can be relatively large. This strain can be up to 5% in some ferroelectric materials.

Domain switching may be induced by either, or both, of an electric field or a mechanical stress. The electrostatic actuator 10 according to the present embodiment takes advantage of the change in strain associated with domain switching to produce relatively large strains in the ferroelectric material.

Figure 5A:
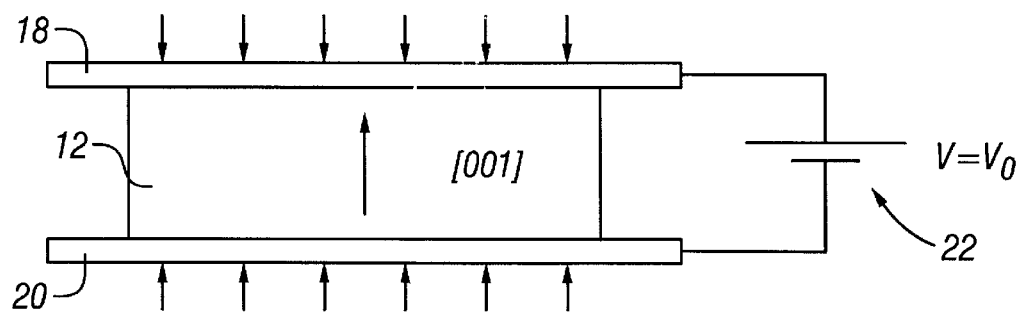
FIGS. 5A and 5B are side views of the actuator of FIG. 1 under different combinations of electrical and mechanical loads.
Figure 5B:
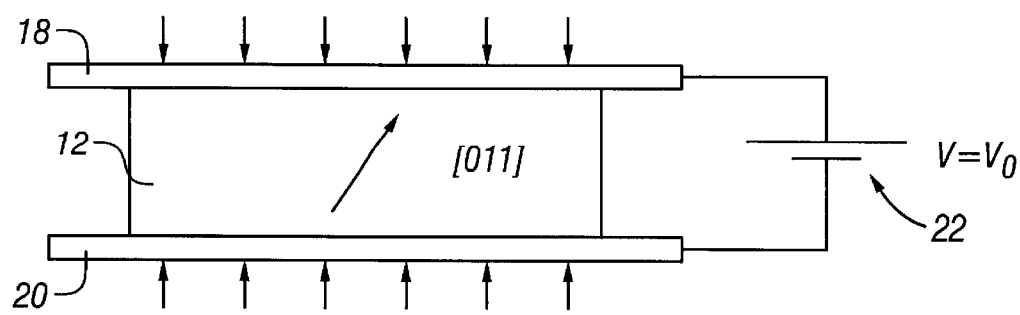
Figure 6:
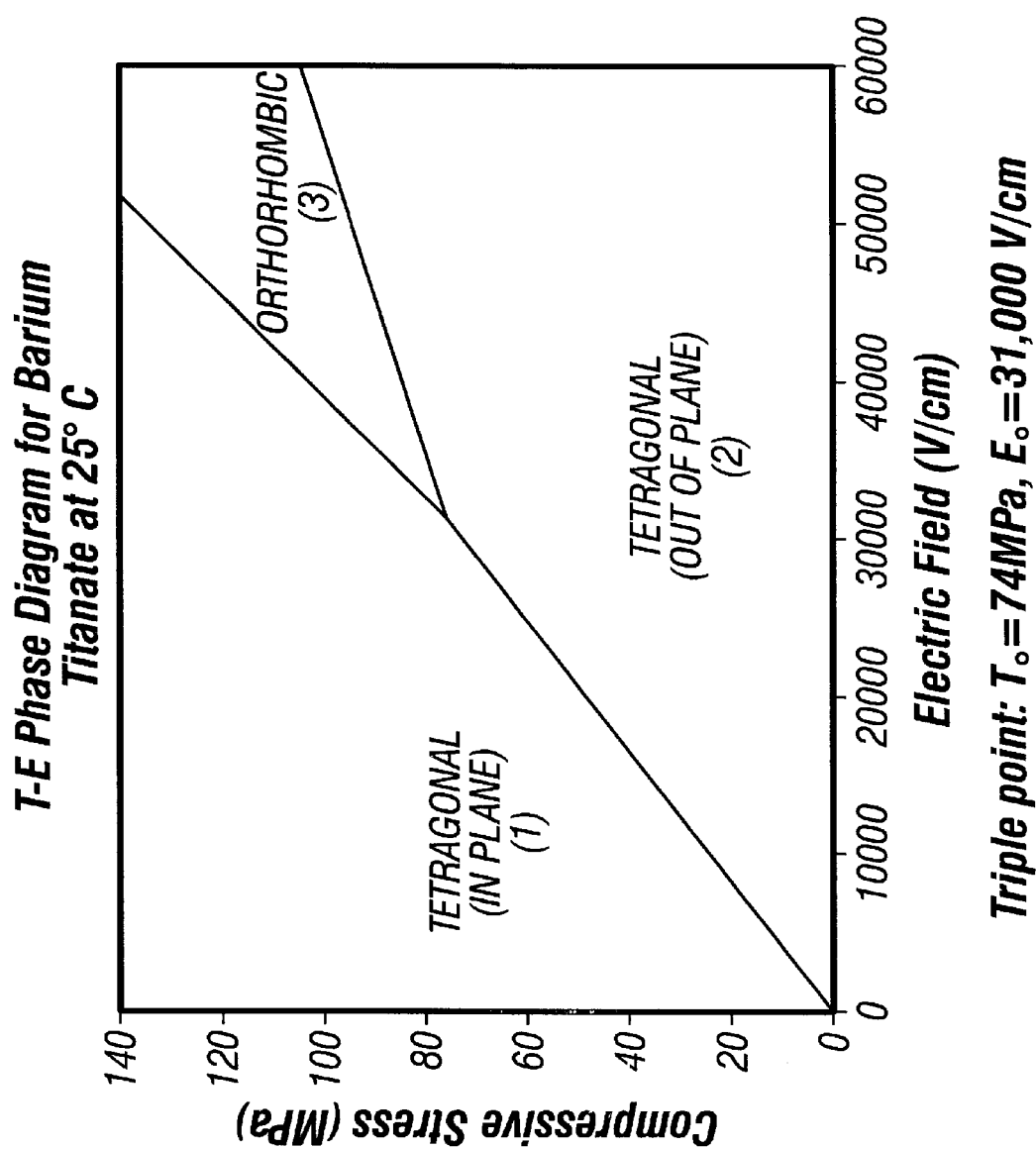
FIG. 6 is a phase diagram for barium titanate at 25° C.
Figure 6:
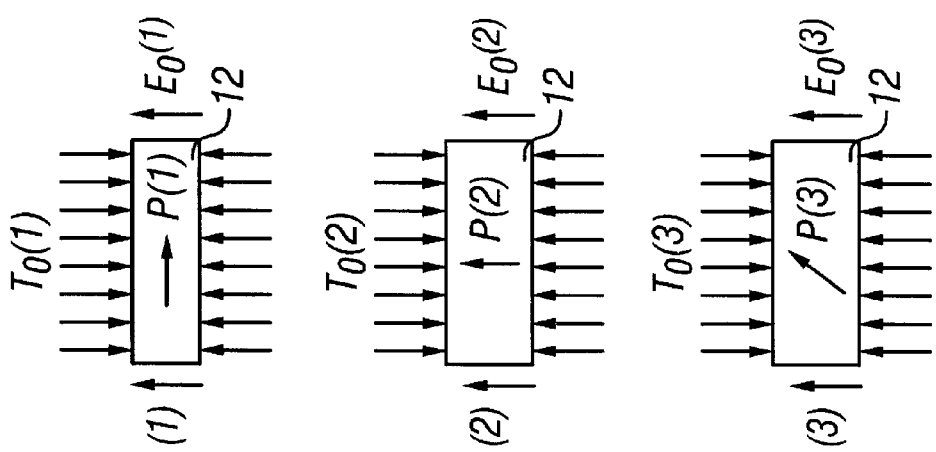

The possible equilibrium configurations for a crystal of barium titanate cut in a flat plate configuration polarized in an [010] direction under combined electromechanical loading are shown in FIGS. 1, 5A and 5B. Any configuration with the polarization oriented in-plane will be energetically equivalent in a state (1), shown in FIG. 1. At some different combination of compressive stress and electric field, the polarization will switch out-of-plane and the stable equilibrium configuration will be state (2), shown in FIG. 5A. In state (2) the ferroelectric material is polarized in the [001] direction. At high values of compressive stress and electric field, the orthorhombic phase is the equilibrium configuration corresponding to state (3) shown in FIG. 5B. In state (3) the ferroelectric material is polarized in the [011] direction. FIG. 6 is a compressive stress-electric field phase diagram of barium titanate at room temperature showing equilibrium states (1), (2), and (3).

With no voltage applied to electrodes 18, 20, ferroelectric plate 12 is subjected to a constant, uniaxial compressive prestress with no electric field. The equilibrium configuration is state (1) with polarization in-plane in the [010] direction (FIG. 2). A voltage is introduced of sufficient magnitude to switch the crystal to state (2) or (3). The voltage is subsequently removed and compressive stress causes the crystal to return to state (1). The combined electromechanical loading allows a cyclic change in the domain pattern resulting in an electrostrictive strain limited by the (c/a) ratio of the given crystal. For barium titanate this upper limit corresponds to a strain of 1.1%. Other ferroelectric materials can produce higher strain limited by the (c/a) ratio of the given crystal.

Figure 7:
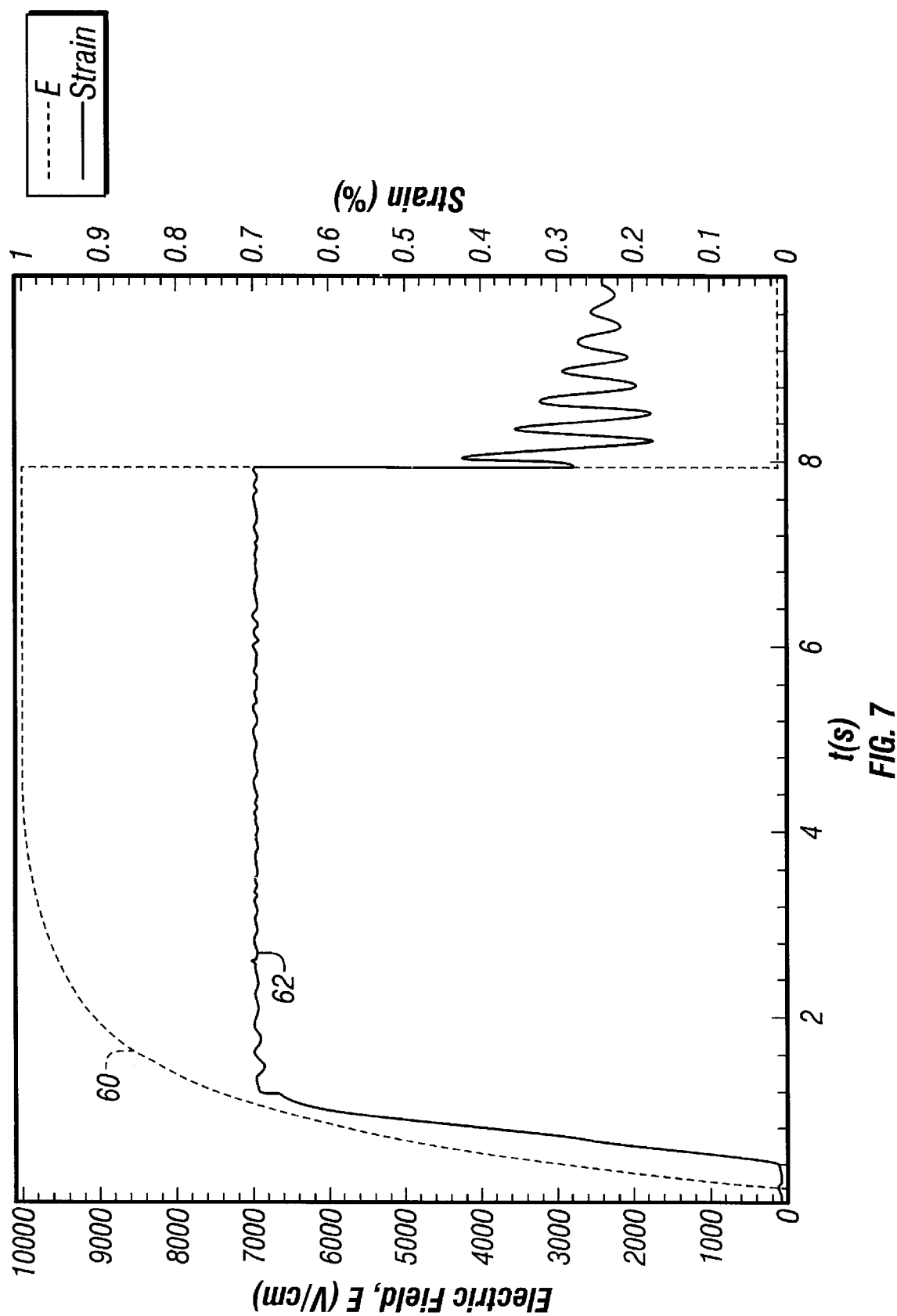
FIG. 7 is a graph illustrating the response of an actuator according to one embodiment.

FIG. 7 shows the results of switching in the actuator 10 from [010] to [011] orientations that produced an electrostrictive strain of 0.7%. The dashed curve 60 shows the imposed electric field as a function of time, with electric field on the left vertical axis. The solid curve 62 shows the corresponding strain as a function of time, with strain on the right vertical axis. The strain reaches a plateau at approximately 0.7% strain at a field of about 7500 V/cm.

Figure 8A:
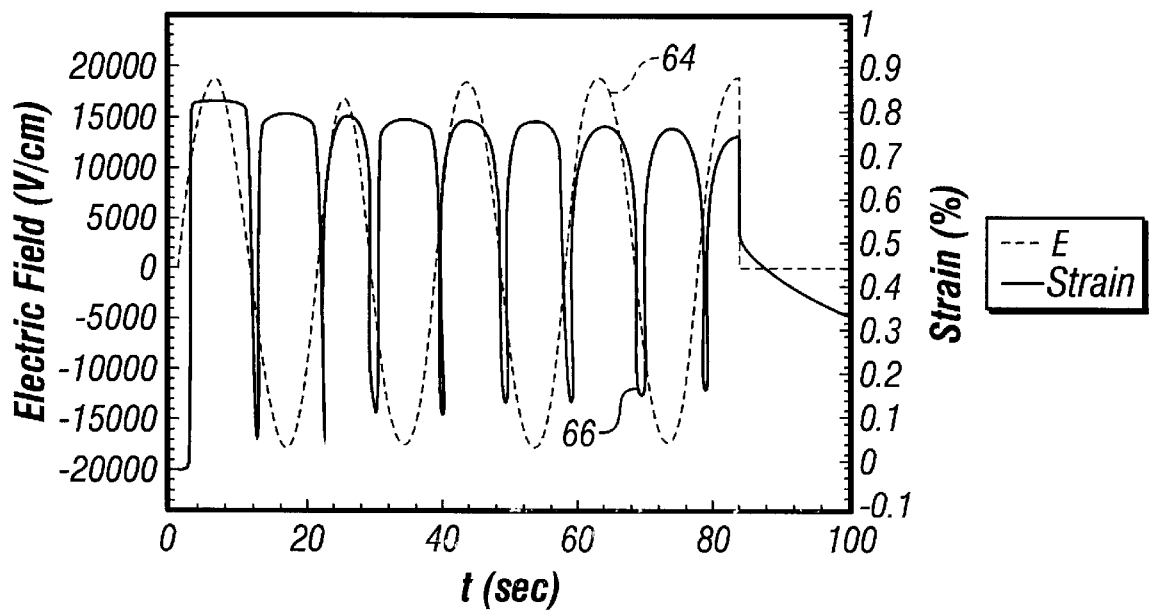
FIGS. 8A and 8B are graphs illustrating the response of an actuator according to another embodiment at 3.0 MPa and 2.6 MPa, respectively.
Figure 8B:
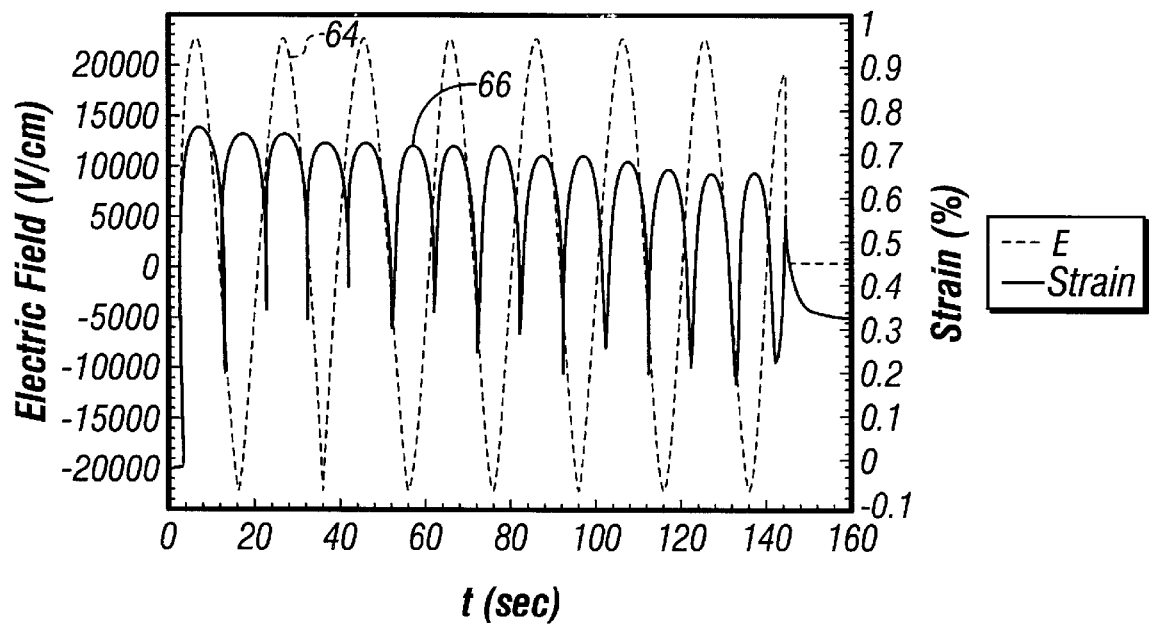

FIGS. 8A and 8B show the strain history for actuator 10 with a compressive stress of 3.6 MPa and 2.0 MPa, respectively. With no electric field, the ferromagnetic plate is in state (1). A voltage is introduced sufficient to switch the polarization to state (2). The dashed curve 64 is the input electric field signal which is sinusoidal with a frequency of $1/20$ Hz. The solid curve 66 is the strain history. The response is electrostrictive in nature since it is the same for both positive and negative field polarity. The maximum strain occurs during the first cycle for each run with a strain of about 0.83% at 3.6 MPa and 0.77% at 2.0 MPa.

Figure 9A:
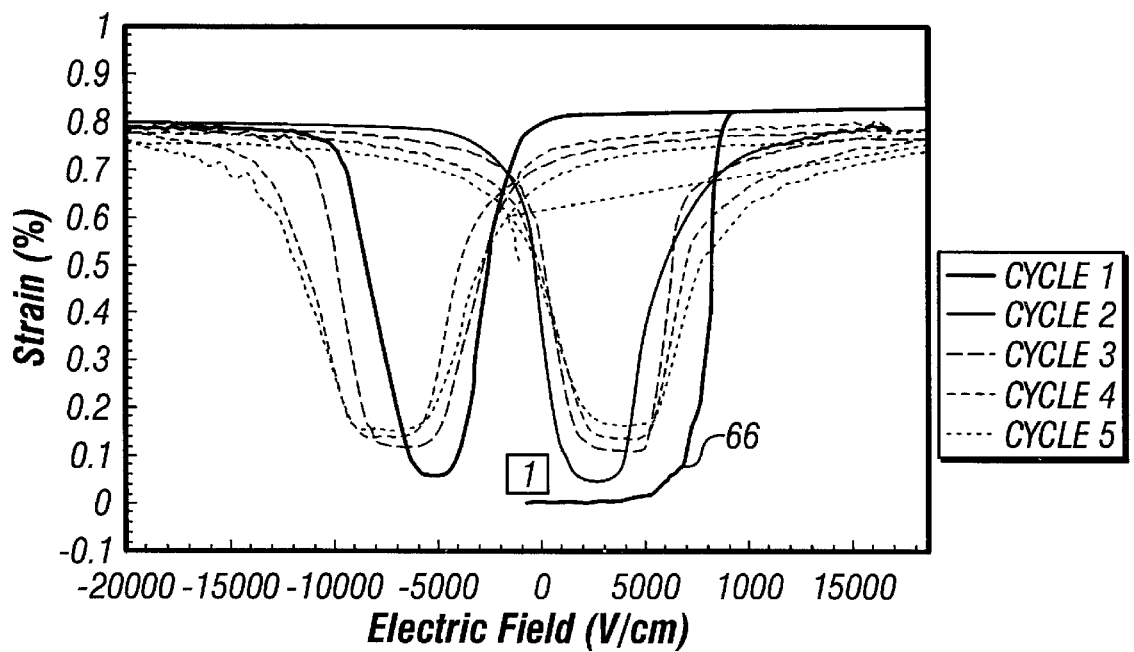
FIGS. 9A and 9B are graphs illustrating the response of the embodiment of FIG. 8A at 3.0 MPa and 2.6 MPa, respectively.
Figure 9B:
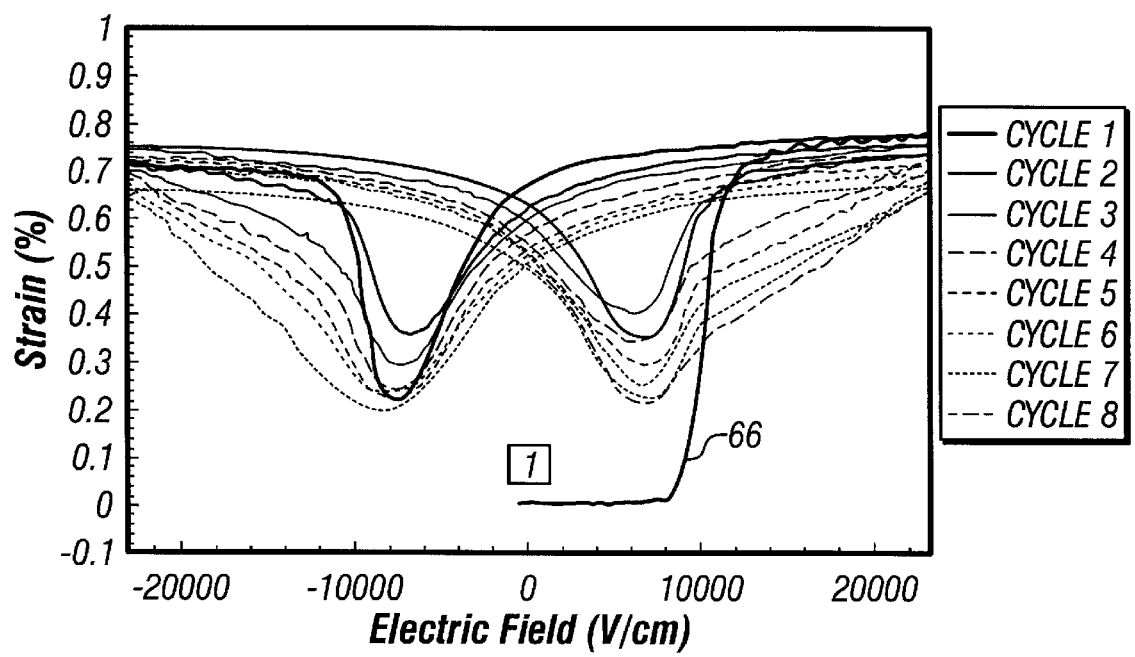
Figure 10A:
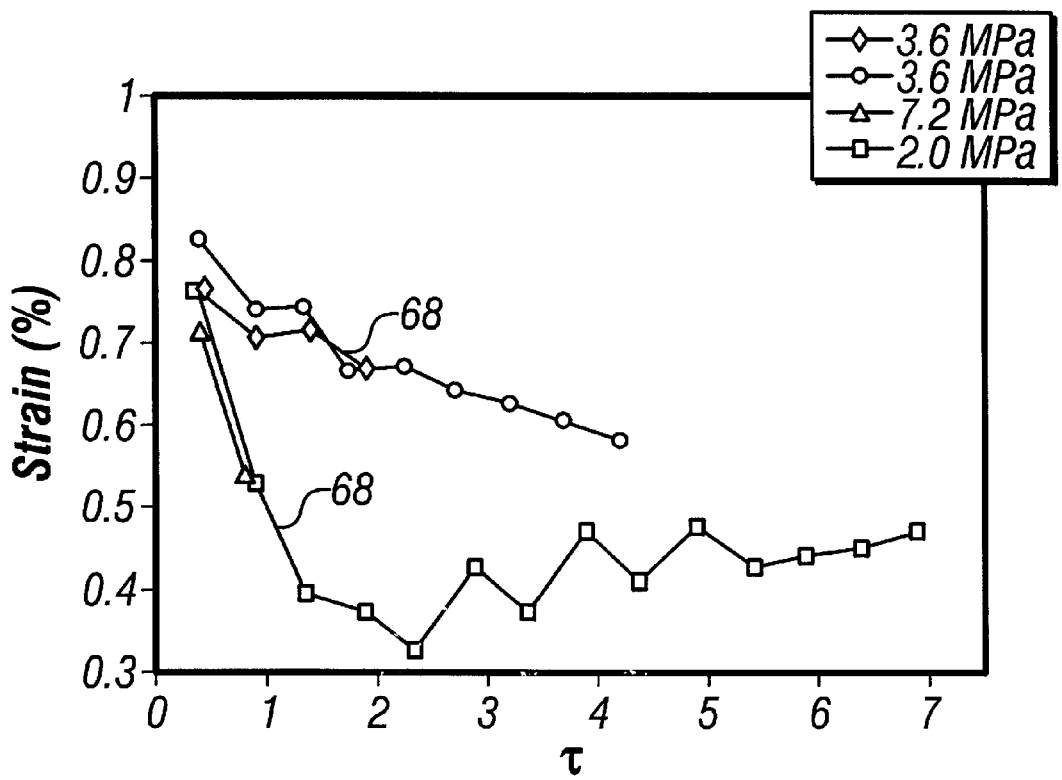
FIGS. 10A and 10B are graphs illustrating the strain envelope and strain recovery of the embodiment of FIG. 8A under different loads.
Figure 10B:
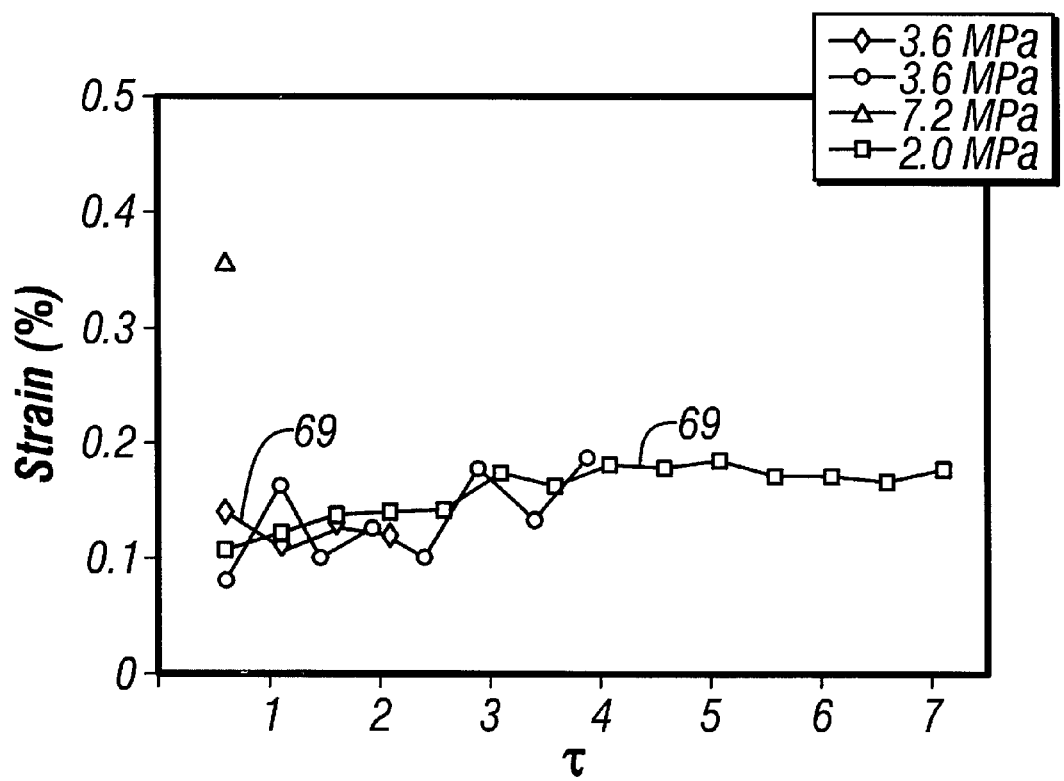

The same data are shown in FIGS. 9A and 9B with strain plotted as a function of electric field. The curves resemble "butterfly" type strain hysteresis loops. In each case the signal begins at point (0,0). As the electric field increases, the strain increases linearly up to a critical value of electric field, at which point the strain increases more rapidly. At a higher value of electric field, the strain levels off and increases in an approximately linear fashion up to the maximum electric field. The maximum electric field produces a strain of 0.83% at 3.6 MPa and 0.77% at 2.0 MPa. As the electric field is decreased, the strain decreases slowly and then drops suddenly. The strain reaches a minimum, though it does not return to zero and the minimum does not occur at zero electric field. The strain again increases as the magnitude of the electric field continues to increase. As it exceeds a critical value, the strain levels off again. With a decrease in magnitude of the electric field, the strain again decreases and reaches a minimum at some positive value of electric field. For each half-cycle (half of the sinusoidal input cycle), the amount that the strain increases from its relative minimum is the strain envelope 68 of the half-cycle, which is shown in FIG. 10A. The subsequent decrease in strain is the strain recovery 69, which is shown in FIG. 10B.

A number of ferroelectric materials are suitable for ferroelectric plate 12 including, for example, potassium niobate (KNbO3) and lead titanate (PbTiO3). Other more complex materials that are. ferroelectric at room temperature may also be suitable. These include solid solutions of simple materials, for example, barium titanate, lead titanate, lead zirconate, strontium titanate and others in this class.

Figure 11A:
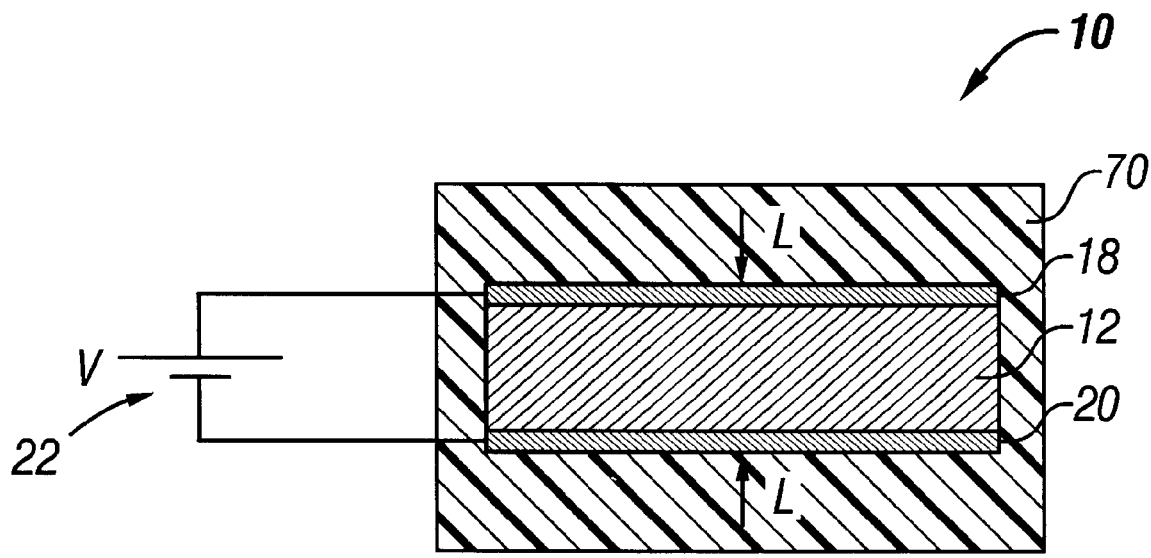
FIGS. 11A and 11B are sectional views of actuators with alternate loading structures.
Figure 11B:
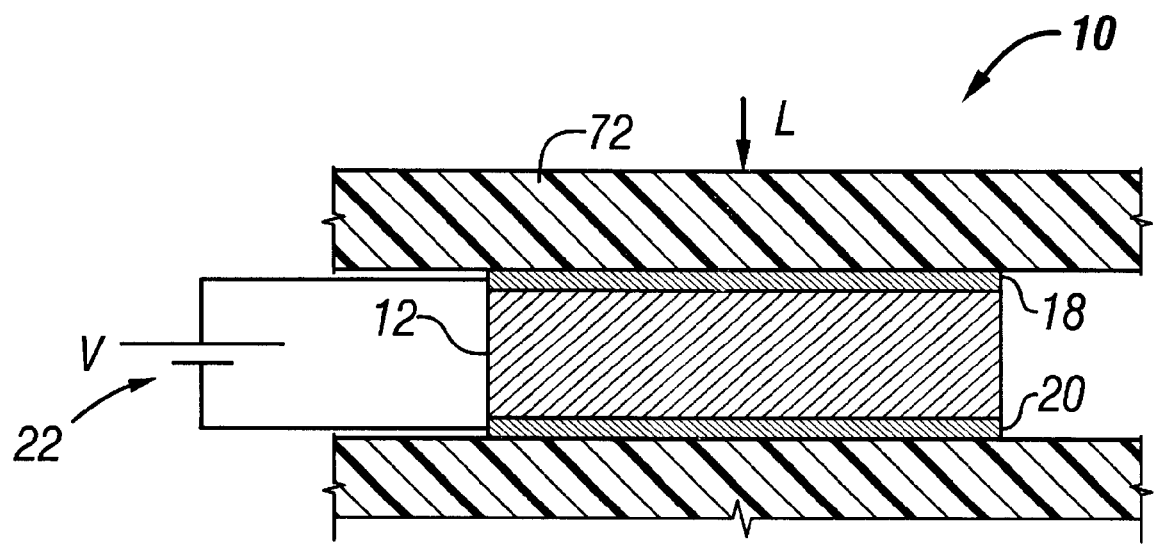

The compressive force can be supplied by a variety of structures. The ferroelectric plate 12 and electrodes 18, 20 can be imbedded in a prestressed structure. In one embodiment, ferroelectric plate 12 and electrodes 18, 20 are encapsulated in a polymer material 70 that constricts when cured, producing compressive stress in the plate 12 as shown in FIG. 11A. According to another embodiment shown in FIG. 11B, a shape memory alloy 72 in contact with the electrode 18 is used to generate a force, not necessarily constant, to push the ferroelectric plate 12 back to its original state in the absence of an electric field.

A number of embodiments of the invention have been described. Nevertheless, it will be understood that various modifications may be made without departing from the spirit and scope of the invention. For example, while this application describes a single crystal material, the ferroelectric material is a textured polycrystal in which all of the crystals are aligned in at least one axis and all have zone access in the same direction. Accordingly, mismatch between grains is reduced allowing domain switching and the large polarization and strain changes exhibited by a single crystal. Accordingly, other embodiments are within the scope of the following claims.

What is claimed is:

1. An apparatus comprising:
   a body having a first face and a second opposing face, said body comprising a ferroelectric material including at least a single crystal polarized along a first crystallographic axis;
   a first electrode contacting said first face;
   a second electrode contacting said second face; and
   one or more loading members adapted to compress the body between the first and second faces,
   wherein the single crystal has a polarization which switches to a second crystallographic axis in response to a first potential difference provided between said first and second electrodes.

2. The apparatus of claim 1 wherein the first crystallographic axis extends along an [010] direction.

3. The apparatus of claim 1 wherein the first crystallographic axis extends along an [010] direction and the second crystallographic axis extends along one of an [001] direction and an [011] direction.

4. The apparatus of claim 1 wherein the ferroelectric material is selected from the group consisting of barium titanate, potassium niobate, and lead titanate.

5. The apparatus of claim 1 wherein the ferroelectric material comprises a solid solution that is ferroelectric at room temperature.

6. The apparatus of claim 1 wherein the body is compressed by a load in the range of from about 1 MPa to about 10 MPa applied to at least one of said first and second faces.

7. The apparatus of claim 1 wherein the body is compressed by a load applied to at least one of first and second faces, and said first crystallographic axis is substantially perpendicular to the load.

8. An actuator comprising:
   a body having a first face and a second face and comprising a ferroelectric material including at least a single crystal polarized along a first crystallographic axis;
   a first electrode contacting the first face and a second electrode contacting the second face;
   a first loading member adjacent the first face and a second loading member adjacent the second face, said first and second loading members exerting a compressive force on said body in a direction substantially perpendicular to the first crystallographic axis,
   wherein in response to a first potential difference between said first and second electrodes, the polarization of said single crystal switches from said first crystallographic axis to a second crystallographic axis.

9. The apparatus of claim 8 wherein the first crystallographic axis extends along the [010] direction.

10. The apparatus of claim 8 wherein the first crystallographic axis is in the [010] direction and the second crystallographic axis is in one of the [001] and [011] directions.

11. The apparatus of claim 8 wherein the body is encapsulated in a polymer material comprising said first and second loading members.

12. The apparatus of claim 8 wherein the compressive force is in a range of from about 1 MPa to about 10 MPa.

13. A method comprising:
   providing a body comprising a ferroelectric material having a first face and a second face and including at least a single crystal;
   compressing the body between the first face and the second face to polarize said single crystal in a first crystallographic axis;
   applying an electric field in the ferroelectric material; and
   switching the polarization of said single crystal from the first crystallographic axis to a second crystallographic axis in response to applying the electric field.

14. The method of claim 13 further comprising:
   removing the electric field; and
   compressing the body between the first face and the second face to switch the polarization of said single crystal from the second crystallographic axis to the first crystallographic axis.

15. The method of claim 13 wherein the first crystallographic axis extends along an [010] direction and the second crystallographic axis extends along one of an [001] direction and an [011] direction.

16. The method of claim 13 wherein compressing comprises providing a load on at least one of said first and second faces.

17. The method of claim 16 wherein the load comprises a force in the range of from about 1 MPa to about 10 MPa.

18. The method of claim 13 wherein applying the electric field comprises:
   providing a first electrode contacting the first face;
   providing a second electrode contacting the second face; and
   producing a potential difference between said first and second electrodes.

19. The method of claim 18 wherein compressing comprises:
   encapsulating the body and said first and second electrodes in a polymer material; and
   curing the polymer material to produce a compressive stress in the body.

* * * * *